United States Patent [19]

Mancuso et al.

[11] Patent Number: 4,785,182

[45] Date of Patent: Nov. 15, 1988

[54] SECONDARY ELECTRON DETECTOR FOR USE IN A GASEOUS ATMOSPHERE

[75] Inventors: James F. Mancuso, Rowley; William B. Maxwell, Dracut, both of Mass.; Gerasimos D. Danilatos, North Bondi, Australia

[73] Assignee: ElectroScan Corporation, Danvers, Mass.

[21] Appl. No.: 52,700

[22] Filed: May 21, 1987

[51] Int. Cl.[4] ............................................. H01J 37/252
[52] U.S. Cl. .................................... 250/310; 250/307; 250/397
[58] Field of Search ......................... 250/310, 397, 307

[56] References Cited

U.S. PATENT DOCUMENTS 3,612,859 10/1971 Schumacher ..................... 250/307
4,596,928 6/1986 Dantilatos ......................... 250/310
4,720,633 1/1988 Nelson ............................. 250/310

OTHER PUBLICATIONS

Danilatos, "A Gaseous Detector Device for an Environmental SEM", Micron and Microscopa Acta 14 (4), pp. 307–318 (1983).

Danilatos, "Design and Construction of an Atmospheric or Environmental SEM", (Part 3), Scanning, vol. 7, 26–42 (1985).

Danilatos, G. D., "Improvements on the Gaseous Detector Device", G. D. Bailey, Ed., Proceedings of the 44th Annual Meeting of the Electron Microscopy Society of America, pp. 630–631 (1986).

Danilatos, G. D., "ESEM—A Multipurpose Surface Electron Microscope", G. W. Bailey Ed., Proceedings of the 44th Annual Meeting of the Electron Microscopy Society of America, pp. 632–633 (1986).

Primary Examiner—Bruce C. Anderson
Assistant Examiner—Jack I. Berman
Attorney, Agent, or Firm—Curtis, Morris & Safford

[57] ABSTRACT

The invention provides for a device for generating, amplifying and detecting secondary electrons from a surface of a sample. The device may comprise a scanning electron microscope. The invention also provides for a method for generating, amplifying and detecting secondary electrons from a surface of a sample.

13 Claims, 1 Drawing Sheet

SECONDARY ELECTRON DETECTOR FOR USE IN A GASEOUS ATMOSPHERE

BACKGROUND OF THE INVENTION

To obtain an image of a sample by electron microscopy, the sample is scanned with an electron beam and the electrons reflected or emitted from the sample are detected. The sample is usually scanned within a vacuum to maintain the vacuum integrity of the electron optics column and to permit the operation of electron detectors.

Scanning samples with an electron beam within a vacuum presents many problems. Biological specimens cannot survive in a vaccum for the length of time needed to obtain an accurate image. Wet specimens experience evaporation of their fluid content in the vacuum before an accurate image can be obtained. Objects that outgas at high vacuum require special consideration. Nonconducting samples accumulate a surface charge which obscures the details of the sample's surface and lowers the resolution of the image obtained. To avoid the problem of accumulating charge samples can be coated with a thin layer of metal to enable them to conduct away the charge. The metal coating however, can damage samples such as semiconductors and therefore often eliminates the possibility of nondestructive examination.

In an early work on environmental microscopy (W. C. Lane, "The Environmental Control Stage", Scanning Electron Microscopy/1970, pp. 43-48) Lane used an Everhart-Thornley system (a biased scintillator/photomultiplier) to detect electrons emitted from a specimen in a gaseous environment in a scanning electron microscope. He claimed that the secondary electrons emitted from the specimen surface ionized the cover gas (water vapor) producing free electrons that were then collected by the Everhart-Thornley detector. He concluded that, through this mechanism, the gas was responsible for amplification of the secondary electron signal prior to scintillation events in the Everhart-Thornley detector.

Lane's claims and conclusions are invalid, because useful amplification of the secondary electron signal was impossible in his experimental setup. The ionization energies (thresholds) of both constituents of water, hydrogen and oxygen, are too high to be ionized by the emitted secondary electrons and the claimed amplification process can only occur in the area immediately above the specimen where there is substantial gas pressure. The bias field of the Everhart-Thornley system cannot raise the energy of the secondary electrons sufficiently to allow for secondary electron signal amplification. The secondary electrons must acquire enough energy to ionize the gas while still in the gas filled region and the metal collar around the specimen reduces the strength of the bias field in this region. The gas filled region also only takes up a very small fraction of the vertical distance between the detector and the specimen and the secondary electrons can therefore only acquire a very small fraction of the total maximum potential difference between the detector and specimen before leaving the gas filled region. Thus the electron energies could not be raised to a high enough level to ionize the gas inside the collar.

The most likely explanation of Lane's observations of gas induced signal amplification is that higher energy emitted backscattered electrons ionized the gas in the collar. The resulting ionization products (electrons and/or ions) were detected by the scintillator.

Danilatos, *Micron and Microscopa Acta* 14(4):307-318 (1983) discloses that gas can act as a detection medium (citing the above Lane reference) using a conventional detector, and that it is possible to collect charge carriers with a low bias, or even no bias at all, on the detector. Danilatos says, "The scope and efficiency of the gaseous detector device depends on a number of variables such as: (a) nature of the gas, (b) pressure of the gas, (c) temperature of the gas, (d) electrode configuration, (e) electrode bias, (f) accelerating voltage, (g) intensity of the primary beam current, (h) scanning speed, (i) nature of specimen."

Danilatos concludes that a detailed study is needed to understand various ion pair phenomena in the system.

"... it was not possible to obtain a secondary electron image for a direct comparison. Alternatively some sort of trajectory contrast might be present. Furthermore, no external bias was applied, and it is not known to what extent the specimen and the attached electrode might have been self-biased. The results presented indicate that additional information can be obtained in the new system but the precise nature of this information requires further investigation."

SUMMARY OF THE INVENTION

The present invention concerns a device for generating, amplifying and detecting secondary electrons from a surface of a sample. The device comprises a vacuum envelope having a pressure limited aperture, a charged particle beam source located within the vacuum envelope and capable of emitting a charged particle beam, focusing means located within the vacuum envelope capable of directing a charged particle beam emitted by the charged particle beam source through the pressure limiting aperture, sample platform means disposed outside the vacuum envelope, capable of maintaining a sample enveloped in gas at a pressure of at least 0.05 torr in registration with the pressure limiting aperture such that a surface of the sample may be exposed to a charged particle beam emitted from the charged particle beam source and directed through the pressure limiting aperture, an electrode disposed outside of the vacuum envelope and positioned within between about 1 and about 200 mm from the sample platform means such that secondary electrons emitted from a surface of a sample located on the sample platform means and exposed to a charged particle beam emitted from the charged particle beam may come into contact with it, a voltage source connected between the electrode and an electrical ground capable of maintaining an electrical potential difference between the electrode and the sample platform means of greater than about 50 volts and less than about 2000 volts, the electrode potential being positive relative to the sample platform means potential so as to accelerate secondary electrons emitted from a surface of a sample located on the sample platform means with an electric field of sufficient strength so as to cause emitted secondary electrons to collide with gas molecules and produce negative charge carriers which can subsequently produce additional negative charge carriers through multiple collisions with other gas molecules resulting in a number of negative charge carriers greater than and proportional to the number of original secondary electrons, the strength of the electric field being sufficiently low so as to avoid catastrophic electrical discharging or arcing, a current amplifier connected to the electrode and current detection means connected between the current amplifier and an electrical ground.

The present invention also provides a scanning electron microscope which comprises a vacuum envelope having a pressure limiting aperture, an electron beam source located within the vacuum envelope and capable of emitting an electron beam, focusing means located within the vacuum envelope and capable of directing an electron beam emitted by the electron beam source through the pressure limiting aperture, electron beam scanning means located within the vacuum envelope and capable of scanning an electron beam emitted by the electron beam source across the diameter of the pressure limiting aperture, sample platform means disposed outside the vacuum envelope and capable of maintaining a sample enveloped in gas at a pressure of at least 0.05 torr in registration with the pressure limiting aperture such that a surface of the sample may be exposed to an electron beam emitted from the electron beam source and directed through the pressure limiting aperture, an electrode disposed outside of the vacuum envelope and positioned within between about 1 and 200 mm of the sample platform means such that secondary electrons emitted from a surface of a sample located on the sample platform means and exposed to an electron beam emitted from the electron beam source may come into contact with it, a voltage source connectd between the electrode and an electrical ground and capable of maintaining an electrical potential difference between the electrode and the sample platform means of greater than about 50 volts and less than about 2000 volts, the electrode potential being positive relative to the sample platform means potential, so as to accelerate secondary electrons emitted from a surface of a sample located on the sample platform means with an electric field of sufficient strength so as to cause emitted secondary electrons to collide with gas molecules and produce negative charge carriers which can subsequently produce additional negative charge carriers through multiple collisions with other gas molecules resulting in a number of negative charge carriers greater than and proportional to the number of original secondary electrons, the strength of the electric field being sufficiently low so as to avoid catastrophic electrical discharging or arcing, a current amplifier connected to the electrode and current detection means connected between the current amplifier and an electrical ground.

The present invention also concerns a method for generating, amplifying and detecting secondary electrons emitted from a surface of a sample. The method comprises scanning the surface of the sample under a suitable gaseous pressure with a charged particle beam having a sufficient energy so as to cause secondary electrons to be emitted from the surface of the sample. The secondary electrons are accelerated with an electric field of sufficient strength so as to cause them to collide with gas molecules and produce negative charge carriers which can subsequently produce additional negative charge carriers through multiple collisions with other gas molecules resulting in a number of negative charge carriers greater than and proportional to the number of original secondary electrons, the strength of the electric field being sufficiently low so as to avoid catastrophic electrical discharging or arcing. The electrical current resulting from electrons and ionized gas molecules is detected, thereby detecting a signal proportional to the number of secondary electrons emitted from the surface of the sample.

DETAILED DESCRIPTION OF THE INVENTION

Figure 1:
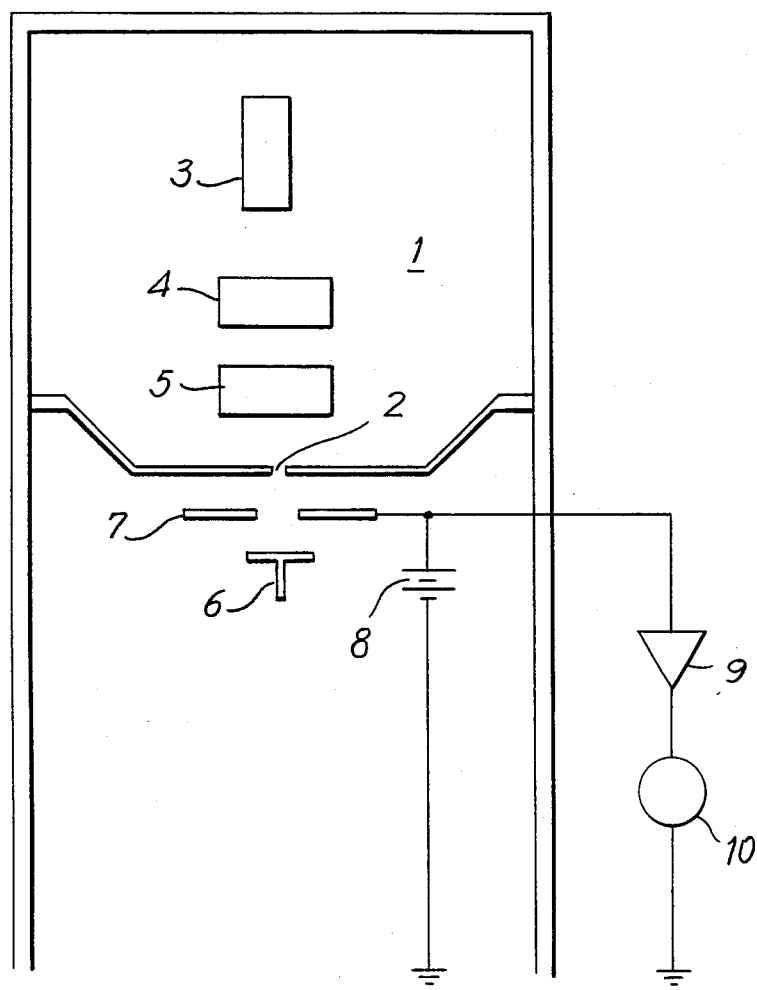
FIG. 1 is a schematic cross-sectional view of a device which embodies the present invention in a particular form.

The present invention provides a device for generating, amplifying and detecting secondary electrons from a surface of a sample. Referring in more particularity to FIG. 1, the invention comprises a vacuum envelope 1 having a pressure limiting aperture 2, a charged particle beam source 3 located within the vacuum envelope and capable of emitting a charged particle beam, focusing means 4 located within the vacuum envelope capable of directing a charged particle beam emmited by the charged particle beam source through the pressure limiting aperture, sample platform means 6 disposed outside the vacuum envelope, capable of maintaining a sample enveloped in gas at a pressure of at least 0.05 torr in registration with the pressure limiting aperture such that a surface of the sample may be exposed to a charged particle beam emitted from the charged particle beam source and directed through the pressure limiting aperture, an electrode 7 disposed outside of the vacuum envelope and positioned within between about 1 and about 200 mm from the same platform means such that secondary electrons emitted from a surface of a sample located on the same platform means and exposed to a charged particle beam emitted from the charged particle beam may come into contact with it, a voltage source 8 connected between the electrode and an electrical ground capable of maintaining an electrical potential difference between the electrode and the sample platform means of greater than about 50 volts and less than about 2000 volts, the electrode potential being positive relative to the sample platform means potential so as to accelerate secondary electrons emitted from a surface of a sample located on the sample platform means with an electric field of sufficient strength so as to cause emitted secondary electrons to collide with gas molecules and produce negative charge carriers which can subsequently produce additional negative charge carriers through multiple collisions with other gas molecules resulting in a number of negative charge carriers greater than and proportional to the number of original secondary electrons, the strength of the electric field being sufficiently low so as to avoid catastrophic electrical discharging or arcing, a current amplifier 9 connected to the electrode and current detection means 10 connected between the current amplifier and an electrical ground. Within this application, negative charge carriers include ionized gas molecules and free electrons.

In one embodiment of the invention the charged particle beam source is an electron beam source. In another embodiment of the invention the electrode is positioned approximately 10 mm from the sample platform means. In yet another embodiment of the invention the voltage source is adjustable.

The present invention also provides a scanning electron microscope. Referring in particularity to FIG. 1, the scanning electron microscope comprises a vacuum envelope 1 having a pressure limiting aperture 2, an electron beam source 3 located within the vacuum envelope and capable of emitting an electron beam, focusing means 4 located within the vacuum envelope and capable of directing an electron beam emitted by the electron beam source through the pressure limiting aperture, electron beam scanning means located within the vacuum envelope and capable of scanning an electron beam emitted by the electron beam source across the diameter of the pressure limiting aperture, sample platform means 6 disposed outside the vacuum envelope and capable of maintaining a sample enveloped in gas at a pressure of at least 0.05 torr in registration with the pressure limiting aperture such that a surface of the sample may be exposed to an electron beam emitted from the electron beam source and directed through the pressure limiting aperture, an electrode 7 disposed outside of the vacuum envelope and positioned within between about 1 and 200 mm of the sample platform means such that secondary electrons emitted from a surface of a sample located on the sample platform means and exposed to an electron beam emitted from the electron beam source may come into contact with it, a voltage source 8 connected between the electrode and an electrical ground and capable of maintaining an electrical potential difference between the electrode and the sample platform means of greater than about 50 volts and less than about 2000 volts, the electrode potential being positive relative to the sample platform means potential, so as to accelerate secondary electrons emitted from a surface of a sample located on the sample platform means with an electric field of sufficient strength so as to cause emitted secondary electrons to collide with gas molecules and produce negative charge carriers which can subsequently produce additional negative charge carriers through multiple collisions with other gas molecules resulting in a number of negative charge carriers greater than and proportional to the number of original secondary electrons, the strength of the electric field being sufficient low so as to avoid catastrophic electrical discharging or arcing, a current amplifier 9 connected to the electrode and current detection means 10 connected between the current amplifier and an electrical ground. In one embodiment of the invention the electrode is positioned approximately 10 mm from the sample platform means. In another embodiment of the invention the voltage source is adjustable. In yet another embodiment of the invention the electron beam source is capable of emitting an electron beam with energy within the range from about 1 kiloelectron volt to about 40 kiloelectron volts.

The present invention also concerns a method for generating, amplifying and detecting secondary electrons emitted from a surface of a sample. The method comprises scanning the surface of the sample under a suitable gaseous pressure with a charged particle beam having sufficient energy so as to cause secondary electrons to be emitted from the surface of the sample. The secondary electrons are accelerated with an electric field of sufficient strength so as to cause them to collide with gas molecules and produce negative charge carriers which can subsequently produce additional negative charge carriers through multiple collisions with other gas molecules resulting in a number of negative charge carriers greater than and proportional to the number of original secondary electrons, the strength of the electric field being sufficiently low so as to avoid catastrophic electrical discharging or arcing. The electrical current resulting from electrons and ionized gas molecules is detected, thereby detecting a signal proportional to the number of secondary electrons emitted from the surface of the sample.

In one embodiment of the invention the charged particle beam is an electron beam. In another embodiment of the invention the electron beam has energy within the range from about 1 kiloelectron volt to about 40 kiloelectron volts. In yet another embodiment of the invention the gaseous pressure is within the range from about 0.05 torr to about 20 torr. In still another embodiment of the invention the electric field comprises an electrical potential of at least about 50 volts and less than about 2000 volts.

What is claimed is:

1. A device for generating, amplifying and detecting secondary electrons from a surface of a sample which comprises:
    (a) a vacuum envelope having a pressure limiting aperture;
    (b) a charged particle beam source located within the vacuum envelope and capable of emitting a charged particle beam;
    (c) focusing means located within the vacuum envelope and capable of directing a charged particle beam emitted by the charged particle beam source through the pressure limiting aperture;
    (d) sample platform means, disposed outside the vacuum envelope, capable of maintaining a sample enveloped in gas at a pressure of at least 0.05 torr in registration with the pressure limiting aperture such that a surface of the sample may be exposed to a charged particle beam emitted from the charged particle beam source and directed through the pressure limiting aperture;
    (e) an electrode disposed outside of the vacuum envelope and positioned within between about 1 and about 200 mm from the sample platform means such that secondary electrons emitted from a surface of a sample located on the sample platform means and exposed to a charged particle beam emitted from the charged particle beam source may come into contact with it;
    (f) a voltage source, connected between the electrode and an electrical ground, capable of maintaining an electrical potential difference between the electrode and the sample platform means of greater than about 50 volts and less than about 2000 volts, the electrode potential being positive relative to the sample platform means potential so as to accelerate secondary electrons emitted from a surface of a sample located on the sample platform means with an electric field of sufficient strength so as to cause emitted secondary electrons to collide with gas molecules and produce negative charge carriers which can subsequently produce additional negative charge carriers through multiple collisions with other gas molecules resulting in a number of negative charge carriers greater than and proportional to the number of original secondary electrons, the strength of the electric field being sufficiently low so as to avoid catastrophic electrical discharging or arcing;
    (g) a current amplifier connected to the electrode; and
    (h) current detection means connected between the current amplifier and an electrical ground.

2. A device of claim 1 wherein the charged particle beam source is an electron beam source.

3. A device of claim 1 wherein the electrode is positioned approximately 10 mm from the sample platform means.

4. A device of claim 1 wherein the voltage source is adjustable.

5. A scanning electron microscope which comprises:
   (a) a vacuum envelope having a pressure limiting aperture;
   (b) an electron beam source located within the vacuum envelope and capable of emitting an electron beam;
   (c) focusing means located within the vacuum envelope and capable of directing an electron beam emitted by the electron beam source through the pressure limiting aperture;
   (d) electron beam scanning means located within the vacuum envelope and capable of scanning an electron beam emitted by the electron beam source across the diameter of the pressure limiting aperture;
   (e) sample platform means, disposed outside the vacuum envelope, capable of maintaining a sample enveloped in gas at a pressure of at least 0.05 torr in registration with the pressure limiting aperture such that a surface of the sample may be exposed to an electron beam emitted from the electron beam source and directed through the pressure limiting aperture;
   (f) an electrode disposed outside of the vacuum envelope and positioned within between about 1 and about 200 mm of the sample platform means such that secondary electrons emitted from a surface of a sample located on the sample platform means and exposed to an electron beam emitted from the electron beam source may come into contact with it;
   (g) a voltage source, connected between the electrode and an electrical ground, capable of maintaining an electrical potential difference between the electrode and the sample platform means of greater than about 50 volts and less than about 2000 volts, the electrode potential being positive relative to the sample platform means potential, so as to accelerate the secondary electrons with an electric field of sufficient strength so as to cause the secondary electrons emitted from the sample to collide with gas molecules and produce negative charge carriers which can subsequently produce additional negative charge carriers through multiple collisions with other gas molecules resulting in a number of negative charge carriers greater than and proportional to the number of original secondary electrons, the strength of the electric field being sufficiently low so as to avoid catastrophic electrical discharging or arcing;
   (h) a current amplifier connected to the electrode; and
   (i) current detection means connected between the current amplifier and an electrical ground.

6. A scanning electron microscope of claim 5 wherein the elelctrode is positioned approximately 10 mm from the sample platform means.

7. A scanning electron microscope of claim 5 wherein the voltage source is adjustable.

8. A scanning electron microscope of claim 5 wherein the electron beam source is capable of emitting an electron with energy within the range from about 1 kiloelectron volt to about 40 kiloelectron volts.

9. A method for generating, amplifying and detecting secondary electrons from a surface of a sample which comprises:
   (a) scanning the surface of the sample under a suitable gaseous pressure with a charged particle beam having sufficient energy so as to cause secondary electrons to be emitted from the surface of the sample;
   (b) accelerating the secondary electrons with an electric field of sufficient strength so as to cause them to collide with gas molecules and produce negative charge carriers which can subsequently produce additional negative charge carriers through multiple collisions with other gas molecules resulting in a number of negative charge carriers greater than and proportional to the number of original secondary electrons, the strength of the electric field being sufficiently low so as to avoid catastrophic electrical discharging or arcing; and
   (c) detecting electrical current resulting from electrons and ionized gas molecules, thereby detecting a signal proportional to the number of secondary electrons emitted from the surface of the sample.

10. A sample according to claim 9, wherein the charged particle beam is an electron beam.

11. A method according to claim 1, wherein the electron beam has energy within the range from about 1 kiloelectron volt to about 40 kiloelectron volts.

12. A method according to claim 9, wherein the gaseous pressure is within the range from about 0.05 torr to about 20 torr.

13. A method according to claim 9, wherein the electric field comprises an electrical potential of at least 50 volts and less than about 2000 volts.

* * * * *

UNITED STATES PATENT AND TRADEMARK OFFICE
CERTIFICATE OF CORRECTION

PATENT NO. : 4,785,182

DATED : November 15, 1988

INVENTOR(S) : Mancuso et al.

It is certified that error appears in the above-identified patent and that said Letters Patent is hereby corrected as shown below:

In claim 6, line 2 change "elelctrode" to --electrode--.

In claim 8, lines 2 and 3, after "electron" insert --beam--.

In claim 10, line 1, delete "sample" and insert instead --method--.

In claim 11, line 1, change "1" to --10--.

Signed and Sealed this

Twenty-first Day of November, 1989

Attest:

JEFFREY M. SAMUELS

*Attesting Officer*     *Acting Commissioner of Patents and Trademarks*